(12) United States Patent
Oniyama

(10) Patent No.: US 7,149,346 B2
(45) Date of Patent: Dec. 12, 2006

(54) THREE-DIMENSIONAL DATABASE GENERATING SYSTEM AND METHOD FOR GENERATING THREE-DIMENSIONAL DATABASE

(75) Inventor: Akio Oniyama, Tokyo (JP)

(73) Assignee: NEC Toshiba Space Systems, Ltd., Kanagawa (JP)

(*) Notice: Subject to any disclaimer, the term of this patent is extended or adjusted under 35 U.S.C. 154(b) by 622 days.

(21) Appl. No.: 10/285,476

(22) Filed: Nov. 1, 2002

(65) Prior Publication Data

US 2003/0086604 A1 May 8, 2003

(30) Foreign Application Priority Data

Nov. 2, 2001 (JP) ............... 2001-337835

(51) Int. Cl.
*G06K 9/00* (2006.01)
*G06K 9/36* (2006.01)

(52) U.S. Cl. ..................... 382/154; 382/285

(58) Field of Classification Search ............... 382/154, 382/285
See application file for complete search history.

(56) References Cited

U.S. PATENT DOCUMENTS

| | | | |
|---|---|---|---|
| 4,148,580 A * | 4/1979 | Hill, Sr. ..................... 355/52 |
| 5,259,037 A * | 11/1993 | Plunk ........................ 382/154 |
| 5,379,215 A * | 1/1995 | Kruhoeffer et al. ............ 702/3 |
| 5,963,664 A * | 10/1999 | Kumar et al. ................ 382/154 |
| 5,974,170 A * | 10/1999 | Louis et al. ................. 382/154 |
| 6,356,272 B1 * | 3/2002 | Matsumoto et al. ......... 345/582 |
| 6,804,389 B1 * | 10/2004 | Ito et al. ..................... 382/154 |
| 6,963,662 B1 * | 11/2005 | LeClerc et al. ............. 382/154 |
| 2003/0014224 A1 * | 1/2003 | Guo et al. ...................... 703/1 |
| 2003/0091227 A1 * | 5/2003 | Chang et al. ............... 382/154 |
| 2004/0041805 A1 * | 3/2004 | Hayano et al. ............. 345/419 |

FOREIGN PATENT DOCUMENTS

| | | |
|---|---|---|
| JP | 08-159762 | 6/1996 |
| JP | 11-339074 | 12/1999 |
| JP | 2000-329552 | 11/2000 |
| JP | 2001-143104 | 5/2001 |

OTHER PUBLICATIONS

Koch, R., "3-D Surface Reconstruction from Stereoscopic Image Sequences", Proc. 5th Int. Conf. on Computer Vision, 1995, pp. 109-114.*
Roux, M., "Cooperative Analysis of Maps and Aerial Images for Urban Scene Description" Proc. of the Conf. Image processing, signal processing, and synthetic aperture radar for remote sensing; 1997. pp. 254-267.*
N. Paparoditis,"Building Detection and Reconstruction from Mid and High-Resolution Aerial Imagery" Computer Vision and Understanding, vol. 72, No. 2, 1998, pp. 122-142.*
Haala, N., Anders, K., " Acquisition of 3D Urban Models by Analysis of Aerial Images, Digital Surface Models and Existing 2D Building Information.", Proc. SPIE vol. 3072, 1997, p. 212-222.*

* cited by examiner

*Primary Examiner*—Bhavesh M. Mehta
*Assistant Examiner*—Utpal Shah
(74) *Attorney, Agent, or Firm*—Foley & Lardner LLP

(57) ABSTRACT

In addition to height data for objects being calculated from stereographic pair images photographed from a satellite, information on outlines is also extracted, and by integrating this height data with the stereographic pair images a three-dimensional database is generated including buildings or else using realistic texture.

12 Claims, 3 Drawing Sheets

THREE-DIMENSIONAL DATABASE GENERATING SYSTEM AND METHOD FOR GENERATING THREE-DIMENSIONAL DATABASE

BACKGROUND OF THE INVENTION

1. Field of the Invention

This invention concerns a three-dimensional (3D) database generating system for generating a database comprised of three dimensions and a method for generating three-dimensional database therefor.

2. Description of Related Art

Conventional methods for generating a three-dimensional database that generate a database comprised of three dimensions such as a three-dimensional topographical map, operate by using an aircraft or a satellite to generate a three-dimensional database or by generating a three-dimensional database through projecting objects in 3D.

The method of generating a three-dimensional database using an aircraft will now be described.

There are three main methods used in the generation of a three-dimensional database using an aircraft. The first method involves generating a three-dimensional database using camera images taken from an aircraft.

Among the methods for generating a three-dimensional database using an aircraft, the method of using camera images to generate a three-dimensional database involves mounting a camera on an aircraft and taking overlapping two-dimensional images and subjecting the areas of the images that overlap to stereograph processing to obtain height data for the object. Stereograph processing here means manually defining height using stereoscopes or extracting height with a computer aid that registers the images with previously stored information from three station points.

With the method for generating a three-dimensional database using camera images however, there is substantial distortion in the peripheral regions of a photograph because an aircraft only flies at an altitude of 2 or 3 kilometers. If there is a building in a peripheral area of the photograph the building seemingly casts itself over adjacent space, thereby submerging a substantial portion of the photograph in its shadow. Accordingly, the system is not efficient for projecting an area over a wide spectrum in 3D. For example, if there is a building 100 meters high in a peripheral area of a photograph an area about 50 meters behind the building would be engulfed in shadow.

The method of three-dimensional database generation through synthetic aperture radar (SAR) among the methods for generating a three-dimensional database using an aircraft, involves mounting a stereograph synthetic aperture radar on an aircraft and obtaining height data for measured objects through subjecting two-way observation data to interference processes. The processes required for this method of three-dimensional database generation through synthetic aperture radar are complex however, and are therefore not implemented in practice.

Another method of three-dimensional database generation using an aircraft is the method of generating a three-dimensional database using a laser altimeter. This method involves mounting a laser on an aircraft and obtaining height data for observed objects through emitting a beam from the laser and measuring the time differential for the reflection of the beam.

An issue for this method of generating a three-dimensional database using a laser photometer however, is that technology for extracting one "chunk" of object, a building for example, from a collection of assembled height data, where height data for the object concerned can be collected such that it is detailed and highly accurate, has still not been established. Accordingly, the search is underway to find a method for specifying the outlines of a building manually based on simultaneously measured photographic images and collecting height data (DEM) object by object. Even if, for that required method, polygonization based on height data were performed, when texture is applied for the ground surface or the roof or side faces of a building or else, combining of simultaneously taken photographs and DEM data is required. Because the simultaneously taken photographs and DEM data are collected by different equipment however, their respective observation coordinate systems are different making the registering operation complex and difficult.

The method for generating a three-dimensional database using a satellite will now be described.

The method of generating a three-dimensional database using a satellite involves photographing the ground from a satellite positioned at an extremely high altitude of between 400 kilometers to 900 kilometers. The satellites used are GPS satellites and as the position and orbit of such a satellite observing the earth can be fixed with a high degree of precision it is possible to obtain images in which objects are located with a high degree of accuracy. Because the ground is photographed from a high altitude an image that covers a wide area and has minimal distortion in the periphery can be obtained.

The method for generating a three-dimensional database through projecting objects in 3D will now be described.

The methods for generating a three-dimensional database using an aircraft or satellite as described above are chiefly used for generating a three-dimensional database for the ground surface over a wide area. There is a method for generating a three-dimensional database by using similar technology and projecting a small object in 3D.

When projecting a small object in 3D the small object is placed on a revolving base and photographed from a plurality of angles to obtain a stereographic image of the object, projecting it in 3D. When projecting a large object in 3D, such as a piece of real estate, the object is photographed from a plurality of angles by changing the point from which each photograph is taken thereby obtaining a stereographic image of the object, projecting it in 3D.

Where such a method for generating a three-dimensional database by projecting the object in 3D is used, when the object is a small object that is placed on a revolving base and photographed from a plurality of different angles, something like a black curtain can be placed in the background behind the object to make the object under observation standout When the object is something large the resolution is extremely high in comparison to that obtained when an aircraft or satellite is used and because the object being photographed is easily distinguishable from the background that object is clearly differentiated and the outlines of the object can be defined easily.

All the above-mentioned existing methods for generating a three-dimensional database incur the following problems however.

(1) When the method of generating a three-dimensional database using an aircraft is used, the scope of area that can be photographed during one flight is extremely narrow so many flights must be made. This means that considerable expenses may be incurred in order to obtain sufficient data from aerial photographs required to generate the desired database.

Further an aircraft may only fly within restricted regions inside a country making it difficult to generate a global three-dimensional landscape database.

(2) The method all generating a three-dimensional database using a satellite is limited in the resolution obtainable in comparison to that obtained when generating a three-dimensional database using an aircraft. Further, weather conditions can have an impact.

(3) When generating a three-dimensional database by projecting an object in 3D it is not possible to project the area of a broad region in 3D. Further, the place from which the object under observation is photographed cannot be fixed with absolute certainty, so especially in the case of a large object, difficulties are encountered when taking photographs from a plurality of different angles.

SUMMARY OF THE INVENTION

Against the background of the problems encountered when using the existing technologies, the object of the present invention is to provide a system for generating a three-dimensional database that can easily generate a three-dimensional database for a wide region without considerable expenses being incurred.

In order to achieve the above objective, the present invention provides a three-dimensional database generating system comprising at least a satellite equipped with functionality for photographing a subject region stereographically as it orbits around the earth maintaining a specified height and a data analysis means for analyzing a pair of stereographic images photographed by the satellite to generate a three-dimensional database, which is characterized in that;

the data analysis means comprises:

a stereograph processing means for calculating, based on stereographic pair images photographed from the satellite, primary height data of objects included within the images;

a outline extraction processing means for extracting outlines of the objects concerned from the stereographic pair images photographed from the satellite;

a correction processing means for correcting the primary height data calculated by the stereograph processing means by using existing information on height and the outlines of the objects extracted by the outline extracting means and outputting that as height data;

an orthogonal transform processing means for performing orthogonal projection transform on one of the stereographic pair images photographed by the satellite by using the height data output from the correction processing means;

a polygonization processing means for performing three-dimensional polygonization of the objects by using the outlines of the objects extracted by the outline extraction processing means and the height data output from the correction processing means; and a texture processing means for applying the image that has undergone orthogonal projection transform by the orthogonal transforming means to the objects three-dimensionally polygonized by the polygonization processing means.

The correction processing means performs averaging processes on the primary height data for each object concerned the outlines of which are extracted by the outline extraction processing means, defining the average value thereby obtained as the height data for each respective object concerned and uses the above-mentioned existing information on height for correcting the absolute value of that height data.

The texture processing means extracts an image of a side face for each object from the stereographic pair images photographed from the satellite and applies that image to the side face of the object three dimensionally polygonized by the polygonizing means.

The present invention also provides a method for generating three-dimensional database using a stereographic pair of images photographed by a satellite that obtains stereographic pair images through stereographic photographing a subject region from a specified height, which comprises processes for;

calculating, based on stereographic pair images photographed from the satellite, primary height data of objects included within the images;

extracting outlines of the objects concerned from the stereographic pair images photographed from the satellite;

correcting the primary height data by using existing information on height and the outlines of the objects;

performing orthogonal projection transform by using the corrected height data, on one image of the stereographic pair images photographed from the satellite;

performing three-dimensional polygonization of the objects by using the outlines of the objects and the corrected height data; and applying the image transformed through orthogonal projection to that three dimensionally polygonized object.

The process for correcting the primary height data comprises processes for performing averaging processes on the primary height data for the objects the outlines of which are extracted, defining the average value thereby obtained as the height data for the objects and correcting the absolute value of that height data by using the existing information on height.

The method for generating a three-dimensional database of this invention may further comprise processes for extracting an image of a side face for each object from the stereographic pair images photographed from the satellite and applying that image to the side face of the three dimensionally polygonized object.

When, with the present invention configured as described, objects are photographed stereographically from a satellite equipped with functionality for stereographic photographing the subject region from a specified height and such photographed stereographic pair images are input to the data analysis means, firstly primary height data of objects included within the images are calculated by the stereograph processing means based on the stereographic pair images photographed from the satellite. Further, through the outline extraction processing means, the outlines of the objects are extracted from the stereographic pair of images photographed by the satellite. Here, with the primary height data calculated from the stereograph processing means, errors may arise especially in the verges between the objects and the ground surface. Through the correcting means however, primary height data calculated from the stereograph processing means are corrected using existing information on height and the outlines of the objects as extracted by the outline extraction processing means, removing such errors included within the primary height data. Next, one image of the stereographic pair of images photographed from the satellite undergoes orthogonal projection transform by the orthogonal transform processing means using height data corrected by the correctioon processing means. Through the polygonizaton processing means each object is three-dimensionally polygonized by using height data corrected by the correction processing means and the outline of that object as extracted by the outline extraction processing means. Thereafter, through the texture processing means, the image that has orthogonal projection transformed from the orthogonal transform processing means is applied to the corresponding object three-dimensionally polygonized by the polygonizing means to obtain three-dimensional data with texture applied.

In this way, in addition to height data for objects being calculated from stereographic pair images photographed from a satellite, information on a outline of a particular object is also extracted, and by integrating this height data with the stereographic pair images a three-dimensional database is generated including buildings or else using realistic texture.

BRIEF DESCRIPTION OF THE DRAWINGS

Specific embodiments of the present invention will now be described, by way of example only, with reference to the accompanying of drawings in which.

DETAILED DESCRIPTION OF THE PREFERRED EMBODIMENTS

An embodiment of this invention will now be described with reference to the drawings.

Figure 1:
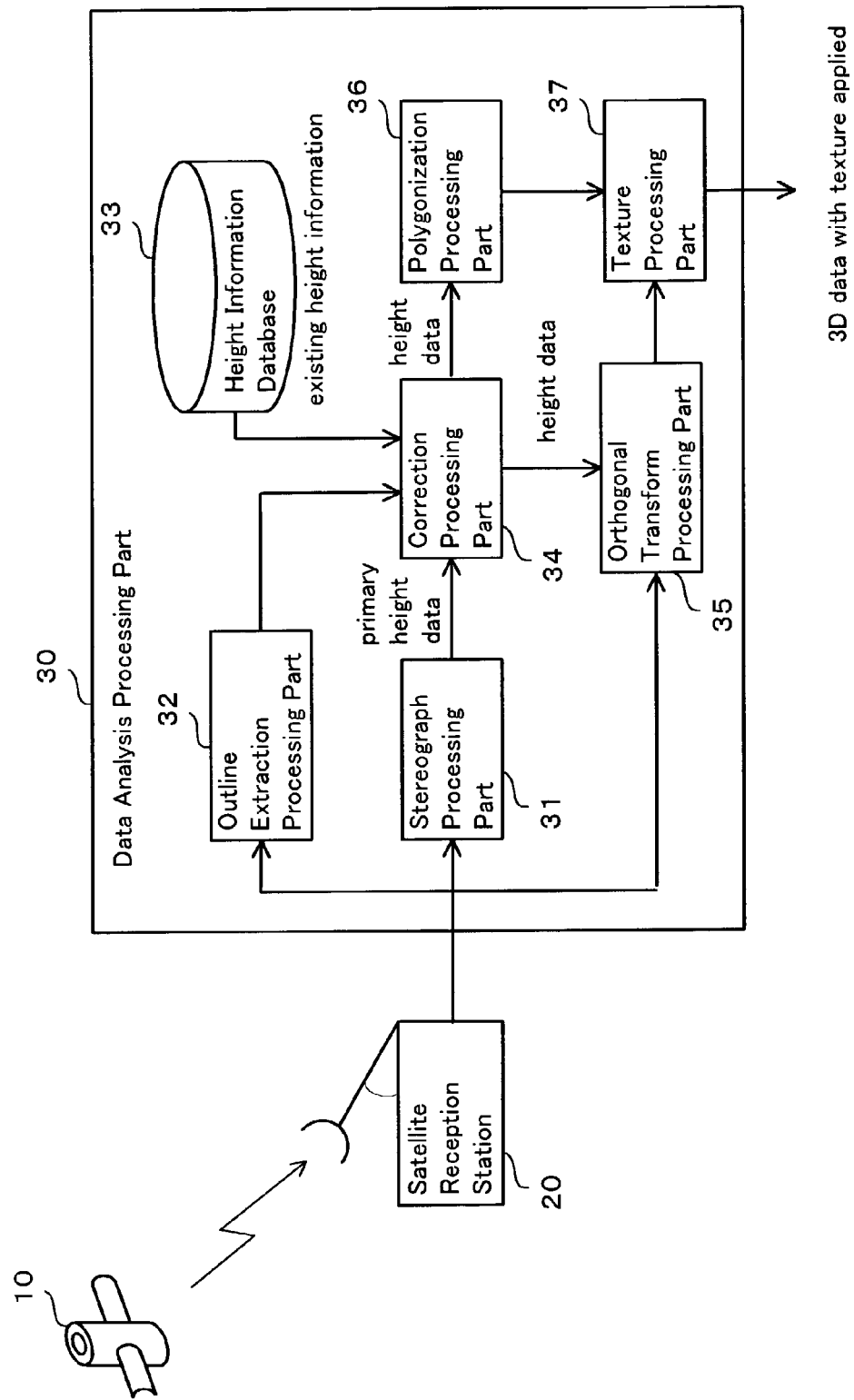
FIG. 1 shows a three-dimensional database generating system according to a first embodiment of this invention.

As shown in FIG. 1 this embodiment comprises satellite 10 that photographs the ground surface as it orbits around the earth maintaining a specified height, satellite reception station 20 that receives satellite images photographed and transmitted from satellite 10 and data analysis processing part 30 that generates a three-dimensional database using satellite images received at satellite reception station 20. Data analysis processing part 30 comprises stereograph processing part 31 that receives input, via satellite reception station 20, of a stereographic pair of two satellite images covering the same region photographed from different angles from satellite 10 and based on this input stereographic pair of satellite images calculates primary height data including the height of each object such as a building included within those images; outline extraction processing part 32 that extracts the outlines of the objects such as buildings from the stereographic pair of two images photographed from the satellite input via satellite reception station 20; height information database 33 that contains information on height of buildings or else registered in advance; correction processing part 34 that uses existing information on height stored in height information database 33 and outlines of buildings or else extracted by outline extraction processing part 32 to correct primary height data calculated by stereograph processing part 31 and output highly accurate height data; orthogonal transform processing part 35 that uses highly accurate data output from correction processing part 34 and performs orthogonal projection transform on one satellite image of the stereographic pair of images photographed from the satellite that are input via satellite reception station 20; polygonization processing part 36 that uses information on outlines extracted by outline extraction processing part 32 and highly accurate data output from correction processing part 34 and performs three-dimensional polygonization on the objects such as buildings; and texture processing part 37 that applies the satellite image that has undergone orthogonal projection transform through orthogonal transform processing part 35 as texture to the corresponding object that has three-dimensionally polygonized through polygonization processing part 36 and outputs that as three-dimensional data with texture applied.

The method for generating three-dimensional data in a three-dimensional data generating system of the above configuration will now be described.

Figure 2:
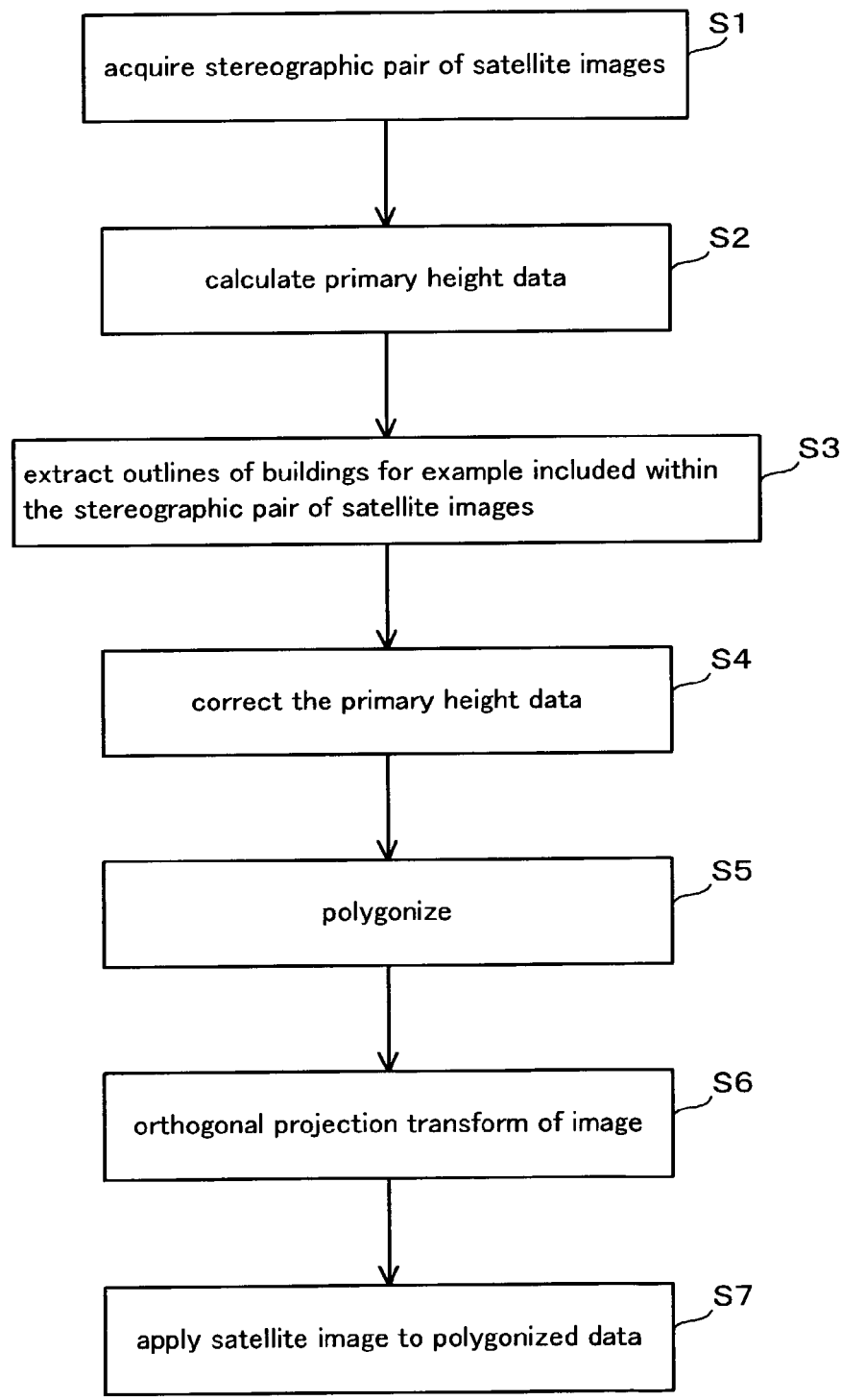
FIG. 2 is a flowchart describing the method for generating three-dimensional data used by the three-dimensional data base generating system shown in FIG. 1.

FIG. 2 is a flowchart describing the method for generating three-dimensional data used by a three-dimensional database generating system shown in FIG. 1.

A stereographic pair of two images covering the same region photographed from different angles from satellite 10 is received by satellite reception station 20 and then input to data analysis processing part 30. This stereographic pair of satellite images photographed from satellite 10 may be a pair obtained by photographing a specific region of the ground surface from different angles through shooting the photographs at different times using one satellite 10 or it may be a pair obtained by photographing a specified region of the ground surface from different angles using two different satellites 10.

Once the stereographic pair of satellite images photographed from satellite 10 is input into data analysis processing part 30 (Step S1), primary height data including the height of each object such as a building, included within those images is calculated by stereograph processing part 31 inside data analysis processing part 30, based on the stereographic pair of satellite images as input (Step S2).

The processes for calculating primary height data performed by stereograph processing part 31 will now be described in detail.

Firstly, geometrical registration of the pair comprised of two stereographic satellite images as input is performed at stereograph processing part 31.

Geometric distortion present in the two stereographic satellite images arises due to variances in the orbit or orientation of satellite 10 as well as thermal deformation of the structure of the observation equipment and leads to deterioration in the accuracy of the positioning of objects within the image. This distortion may be corrected somewhat by the provider of the satellite images, however such correction processes are not sufficiently accurate for the generation of a three-dimensional database.

Accordingly, in order to improve the degree of accuracy of registering a specific point over one of the satellite images among the two stereographic satellite images input is selected as the RCP (Reference Control Point) and a point coordinated in relation to this RCP is then worked out in the other satellite image. From the relationship of the coordinates of both those points a transform expression is established and the coordinates are transformed to provide the registering.

Figure 3:
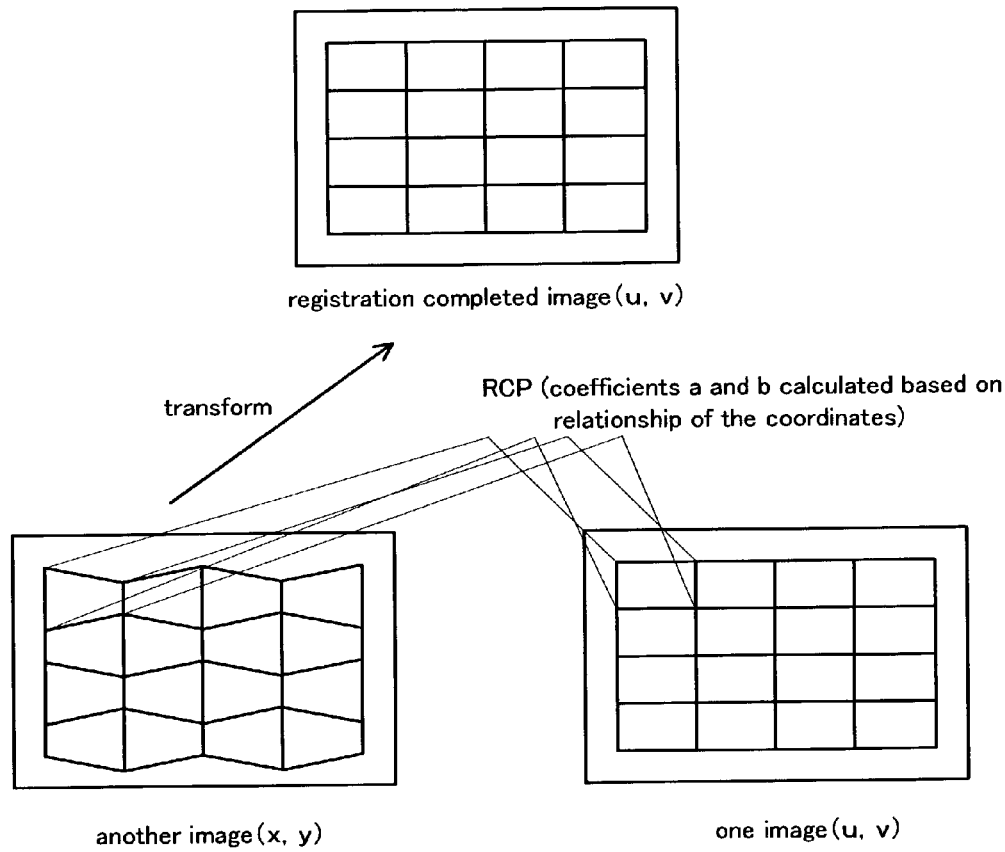
FIG. 3 shows the processes of geometrical registering of the stereograph processing part shown in FIG. 1.

FIG. 3 describes the processes of geometrical registering of stereograph processing part 31 as shown in FIG. 1.

As shown in FIG. 3 a specific point over one of the satellite images among the stereographic pair of two satellite images input is selected as the RCP and a corresponding point is worked out in relation to this RCP over the other satellite image. The coefficients a and b of the following expression are then calculated from the geometric relationship between both these points and substituted into that expression to obtain an image for which registration is complete.

$$u = a1xy + a2x + a3y + a4$$

$$v = b1xy + b2x + b3y + b4$$

Figure 4:
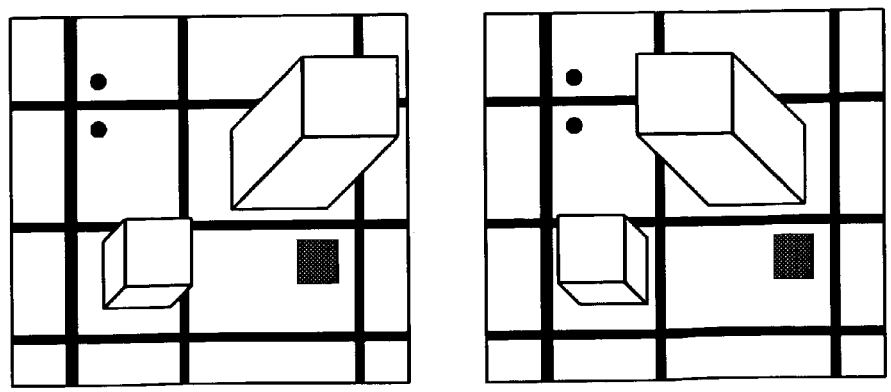
FIG. 4 shows the processes for calculating primary height data performed by the stereograph processing part shown in FIG. 1.

Next, matching processes are performed by stereograph processing part 31 in which an automatic search is conducted to find, in relation to each pixel of one of the satellite images from among the two stereographic satellite images input, each corresponding pixel on the other satellite image. The parallax of both images is then worked out for each 1 pixel and the primary height data that forms the height for each 1 pixel is calculated from this parallax. FIG. 4 describes the processes for calculating primary height data performed by the stereograph processing part shown in FIG. 1.

As shown in FIG. 4, in a pair comprised of two satellite images covering the same region photographed from satellite 10 from different angles, because the same buildings are photographed from different angles, a difference in form arises even for the corresponding pixels of two respective images. The greater the height of the object the greater the degree of this discrepancy becomes, so primary height data is calculated based on this degree of discrepancy.

Contour extraction processing part 32 in data analysis processing part 30 extracts outlines of the objects such as buildings included in the stereographic pair of satellite images input into data analysis processing part 30 (Step S3).

At this point in the case of existing technologies, primary height data is defined as height data of the ground surface not including buildings so when attempting to define height data including buildings from a satellite image a problem arises in further identifying one building from amongst a collection of height data extracted.

According to this embodiment of the present invention, the stereograph processed satellite image and the outlines of the objects such as buildings from that satellite image are defined by stereograph processing part 31. Methods used may involve extracting outlines manually or extracting them automatically including usage of computer aids. In computer aided automatic outline extraction according to existing technology, edges are extracted within one satellite image through a differentiation method for example and the segments of the extracted edges are joined. However, accurate extraction of outlines is extremely difficult within an area with a high density of buildings. Accordingly this extraction process is mainly performed manually. With this embodiment of the present invention however a stereographic pair comprising two satellite images photographed stereographically is used and outlines are extracted stereographically leading to improved accuracy of outline extraction.

Primary height data calculated by stereograph processing part 31 is input to correction processing part 34. Here, errors like matching errors arising when matching processes are performed by stereograph processing part 31 are present in the primary height data input to part 34. Such errors tend to proliferate in the verges between a building and the ground surface.

At correction processing part 34, primary height data defined by stereograph processing part 31 undergoes averaging processes with each building outline as extracted by outline extraction processing part 32, removing errors in the primary height data. This process involves recognition of each object concerned, such as buildings, through the outlines extracted by part 32, averaging the primary height data for each such object and redefining that average value as the height for each such object such as a building. It often occurs however, that the roof of a building is not of a uniform height so when an average for that is applied uniformly throughout errors may occur in the height obtained for the building that is the object concerned. To remedy this, the outlines of the roof of such a building are divided into a plurality each of which is then averaged.

In this way, while there are inconsistencies in positioning accuracy in a stereographic pair comprising two satellite images input to outline extraction processing part 32, the disparate elements affecting the degree of accuracy of height are taken as an average and thereafter, in correction processing part 34 the absolute value of height data that has undergone averaging processing is corrected using height information on the building concerned previously registered in height information database 33 to provide height data of the required degree of accuracy (Step S4).

Predefined information on the height of a building is registered in height information database 33 and the height information for that building is used to correct the height of the building that is the object concerned.

Next, at polygonization processing part 36 each object is three-dimensionally polygonized (cubed and projected as a wireframe construction) using the outline information extracted by outline extraction processing part 32 and height data obtained by correction processing part 34 (Step S5). At this point, because the shape of the roof of a building is not necessarily smooth (like many modern roofs which are rounded or arc shaped), even a building so shaped can be three-dimensionally polygonized using this embodiment of this invention.

Three-dimensional polygonization is completed at this point but data that has been three-dimensionally polygonized is simply an assembly of hexahedrons or of a projected wireframe form, the ground surface and building roofs for example are all formed of a single color and texture required to provide a realistic feeling is not present. A three-dimensional database with a sense of presence that gives a real world feel can be obtained by superimposing satellite images on data that has been three-dimensionally polygonized. However, this three-dimensionally polygonized data comes from stereo images where the subject region is photographed from inclined direction and polygonized, so such satellite images cannot be simply superimposed in that condition.

Using height data obtained through correction processing part 34, at orthogonal transform processing part 35 one satellite image of a stereographic pair of satellite images input to data analysis processing part 30 is projection transformed onto an image shot from directly above the subject area (Step S6).

Thereafter, at texture processing part 37 realistic texture is applied for the ground surface and buildings or else through applying the image that orthogonal projection transformed through the orthogonal transform processing part 35 to data that has three-dimensionally polygonized through polygonization processing part 36 (Step S7). Further, the texture of the side face of a building is applied using satellite images input to data analysis processing part 30 and this texture is applied to building side faces.

As described above, with the present invention in addition to height data for an object being calculated from stereographic pair images photographed stereographically from a satellite, information on outlines is also extracted, and by integrating this height data with the stereographic pair images a three-dimensional database is generated including buildings or else, using realistic texture, thereby enabling a three-dimensional database for a wide region to be generated easily without incurring substantial expenses.

What is claimed is:

1. A three-dimensional database generating system comprising;
at least a satellite equipped with functionality for stereo photographing a subject region as it orbits around the earth maintaining a specified height; and
a data analysis means for analyzing a pair of stereographic images photographed by said satellite to generate a three-dimensional database, wherein said data analysis means comprises:
a stereo processing means for calculating, based on said stereographic pair images photographed from said satellite, primary height data of objects included within said images;
a outline extraction processing means for extracting outlines of said objects from said stereographic pair images photographed from said satellite;
a correction processing means for correcting said primary height data calculated by said stereograph processing means by using existing information on height and said outlines of said objects extracted by said outline extracting processing means and outputting that as height data;
an orthogonal transform processing means for performing orthogonal projection transform on one image of said stereographic pair images photographed from said satellite by using height data output from said correction processing means;
a polygonization processing means for three-dimensionally polygonizing said objects by using the outlines of said objects extracted by said outline extraction processing means and height data output from said correction processing means; and
a texture processing means for applying said image that has orthogonal projection transformed by said orthogonal transform processing means to said objects three-dimensionally polygonized by said polygonization processing means.

2. A three-dimensional database generating system according to claim 1, wherein said correction processing means performs averaging processes on said primary height data for each said object the outline of which is extracted by said outline extraction processing means, defining the average value thereby obtained as the height data for each said object concerned and uses said existing information on height for correcting said absolute value of height data.

3. A three-dimensional database generating system according to claim 1, wherein said texture processing means extracts an image of a side face of each said object from said stereographic pair images photographed from said satellite and applies that image to the side face of said object three-dimensionally polygonized by said polygonization processing means.

4. A three-dimensional database generating system according to claim 2, wherein said texture processing means extracts an image of a side face of each said object from said stereographic pair images photographed from said satellite and applies that image to the side face of said object three-dimensionally polygonized by said polygonization processing means.

5. A three-dimensional database generating system according to claim 1, wherein said existing information on height comprises height information of buildings stored in a height information database.

6. A method used for generating a three-dimensional database using a stereographic pair of images photographed by a satellite that obtains stereographic pair images through stereographic photographing a subject region from a specified height, which comprises processes for;
calculating, based on said stereographic pair images photographed from said satellite, primary height data of objects included within said images;
extracting outlines of said objects from said stereographic pair images photographed from said satellite;
correcting said primary height data by using existing information on height and the outlines of said objects;
performing orthogonal projection transform by using said corrected height data, on one image of said stereographic pair images photographed from said satellite;
performing three-dimensional polygonization of said objects by using said outlines of said objects and said corrected height data; and
applying said image transformed through orthogonal projection to said three-dimensionally polygonized object.

7. A method used for generating a three-dimensional database according to claim 6, wherein the process for correcting primary height data comprises processes for performing averaging processes on said primary height data for each said object the outline of which is extracted, defining the average value thereby obtained as the height data for said object and correcting the absolute value of said height data using said existing information on height.

8. A method for generating a three-dimensional database according to claim 6, wherein an image of a side face of each said object is extracted from said stereographic pair of images photographed from said satellite and said side face image is applied to the side face of said three-dimensionally polygonized object.

9. A method for generating a three-dimensional database according to claim 7 wherein an image of a side face of each said object is extracted from said stereographic pair of images photographed from said satellite and said side face image is applied to the side face of said three-dimensionally polygonized object.

10. A method for generating a three-dimensional database according to claim 6, wherein said existing information on height comprises height information of buildings stored in a height information database.

11. A three-dimensional database generating system comprising:
at least a satellite equipped with functionality for stereo photographing a subject region as it orbits around the earth maintaining a specified height; and
a data analysis processor that analyzes a pair of stereographic images photographed by said satellite to generate a three-dimensional database, wherein said data analysis processor comprises:
a stereo processing part that calculates, based on said stereographic pair images photographed from said satellite, primary height data of objects included within said images;
a outline extraction processing part that extracts outlines of said objects from said stereographic pair images photographed from said satellite;
a correction processing part that corrects said primary height data calculated by said stereograph processing part by using existing information on height and said outlines of said objects extracted by said outline extracting processing part and outputting that as height data;

an orthogonal transform processing part that performs orthogonal projection transform on one image of said stereographic pair images photographed from said satellite by using height data output from said correction processing part;

a polygonization processing that three-dimensionally polygonized said objects by using the outlines of said objects extracted by said outline extraction processing part and height data output from said correction processing part; and a texture processing part that applies said image that has orthogonal projection transformed by said orthogonal transform processing part to said objects three-dimensionally polygonized by said polygonization processing part.

12. A three-dimensional database generating system according to claim 11, wherein said existing information on height comprises height information of buildings stored in a height information database.

\* \* \* \* \*